United States Patent
Liu et al.

(10) Patent No.: US 11,932,793 B2
(45) Date of Patent: Mar. 19, 2024

(54) PHOSPHOR WITH GARNET STRUCTURE AND LIGHT-EMITTING DEVICE COMPRISING THE PHOSPHOR

(71) Applicants: GRIREM ADVANCED MATERIALS CO., LTD., Beijing (CN); GRIREM HI-TECH CO., LTD., Hebei (CN); Rare Earth Functional Materials (Xiong'an) Innovation Center Co., Ltd., Hebei (CN)

(72) Inventors: Ronghui Liu, Beijing (CN); Shaowei Qin, Beijing (CN); Yuanhong Liu, Beijing (CN); Yanfeng Li, Beijing (CN); Xiaoxia Chen, Beijing (CN); Xiaole Ma, Beijing (CN); Yuan Xue, Beijing (CN)

(73) Assignees: GRIREM ADVANCED MATERIALS CO., LTD., Beijing (CN); Grirem Hi-Tech Co., Ltd, Langfang (CN); Rare Earth Functional Materials (Xiong'an) Innovation Center Co., Ltd., Baoding (CN)

( * ) Notice: Subject to any disclaimer, the term of this patent is extended or adjusted under 35 U.S.C. 154(b) by 0 days.

(21) Appl. No.: 17/748,789

(22) Filed: May 19, 2022

(65) Prior Publication Data
US 2022/0411694 A1 Dec. 29, 2022

(30) Foreign Application Priority Data
Jun. 29, 2021 (CN) .......................... 202110725551.4

(51) Int. Cl.
*C09K 11/77* (2006.01)
*C09K 11/02* (2006.01)
*H01L 33/50* (2010.01)

(52) U.S. Cl.
CPC .......... *C09K 11/7774* (2013.01); *C09K 11/02* (2013.01); *H01L 33/502* (2013.01); *C01P 2004/84* (2013.01)

(58) Field of Classification Search
CPC . C09K 11/7774; H01L 33/502; C10P 2004/84
See application file for complete search history.

(56) References Cited

FOREIGN PATENT DOCUMENTS

JP 2017-105914 * 6/2017
JP 2019-173035 * 10/2019

* cited by examiner

*Primary Examiner* — C Melissa Koslow
(74) *Attorney, Agent, or Firm* — Westbridge IP LLC

(57) ABSTRACT

The invention relates to a phosphor with garnet structure and a light-emitting device comprising the phosphor, wherein the phosphor includes the following components in percentage by weight: 38.47-45.19% of Y element, 9.49-22.09% of Al element, 2.06-24.31% of Ga element, 27.3-32.04% of O element, 0.43-1.46% of Ce element. In the phosphor particles, the shortest distance from the surface of one side of the particle to the surface of the opposite side through the centroid of the particle is defined as R, the longest distance is R1, and 5 μm≤R≤40 μm; any distance from the particle surface to the centroid is r, and 0<r<½R; and the space with the distance from the particle surface to the centroid direction being less than or equal to r is defined as $r_{inner}$.

18 Claims, 3 Drawing Sheets

PHOSPHOR WITH GARNET STRUCTURE AND LIGHT-EMITTING DEVICE COMPRISING THE PHOSPHOR

CROSS-REFERENCE TO RELATED APPLICATION

This application claims priority from the Chinese patent application 202110725551.4 filed Jun. 29, 2021, the content of which is incorporated herein in the entirety by reference.

TECHNICAL FIELD

The disclosure relates to the technical field of luminescent material, and in particular to a phosphor with garnet structure and a light-emitting device comprising the phosphor.

BACKGROUND ART

As a new generation of green lighting products, White Light Emitting Diode (White LED) with high luminous efficiency, low energy consumption, long life and no pollution and other advantages, has been widely used in the field of green lighting and high-end display field, which is a strategic emerging industry in China. As a major category of rare earth photofunctional material, rare earth phosphor for LEDs plays an important role in people's production and life.

At present, white LEDs in the market are generally formed by compounding aluminate yellow-green phosphor and nitride red phosphor through blue chips, which is the most technically mature. From the perspective of application and consumption structure, about 90% of the demand for rare earth phosphor for LEDs comes from semiconductor lighting and electronic information industries. As a core material of white LEDs, the performance of rare earth phosphor for LEDs directly determines the luminous efficiency and light color quality of devices. Ga-containing phosphor with garnet structure synthesized by doping of Al-site Ga is of cubic crystal system with garnet structure. The GaYAG: Ce-containing green phosphor is the most mature and one of the main phosphors for commercial white LEDs. With the continuous development of semiconductor lighting technology and the accelerated penetration of market applications, the market pursues an increasingly high luminous efficiency for white LEDs. For Ga-containing phosphor with garnet structure, the wave band shortens with the increase of Ga content, and the lightness of the phosphor decreases more with smaller particle size, which therefore has higher requirements on the excitation efficiency and luminous efficiency of GaYAG green phosphor.

SUMMARY

To address the problems in the prior art, the disclosure provides a phosphor with garnet structure and a light-emitting device containing the phosphor, wherein the phosphor can be excited by blue light, effectively improving the luminous efficiency. Moreover, the excellent luminous performance of Ga-containing phosphor with garnet structure can be realized, the Ga content is effectively reduced, and the spectrum can be effectively blue-shifted, which reduces the cost.

In order to achieve the above purpose, the present disclosure provides a phosphor with garnet structure, wherein the phosphor comprises the following components in percentage by weight: 38.47-45.19% of Y element, 9.49-22.09% of Al element, 2.06-24.31% of Ga element, 27.3-32.04% of O element and 0.43-1.46% of Ce element; the shortest distance from the surface of one side of the particle to the surface of the opposite side through the centroid of the particle is defined as R, 5 μm≤R≤40 μm;

any distance from the particle surface to the centroid is r, 0<r<½R; and the space with the distance from the particle surface to the centroid direction being less than or equal to r is defined as $r_{inner}$, and the space with the distance from the particle surface to the centroid direction being greater than r is defined as $r_{outer}$, whereat the ratio of the weight percentage of Ga elements in any unit volume in router to $r_{inner}$ is n, and 0≤n<1.

Further, the phosphor comprises, in percentage by weight, 40.6-45.2% of Y element, 10.9-21.9% of Al element, 2.2-19.8% of Ga element, 27.7-32% of O element, 0.67-1.2% of Ce element.

Further, R of the phosphor is, 10 μm≤R≤30μ.

Further, the value range of r is, 0.5 μm≤r≤⅓R.

Further, the value range of n is, 0≤n≤0.5.

Further, the peak wavelength thereof is 515 nm to 550 nm under excitation of blue light.

Another aspect of the present disclosure provides a light-emitting device with garnet structure.

Further, the light-emitting device further comprises other phosphor, including one or more of (Ca, Sr, Ba)AlSiN$_3$:Eu, (Mg, Ca, Sr, Ba)$_2$SiO$_4$:Eu, (Ca, Sr)$_3$SiO$_5$:Eu, ZnS:Cu, ZnS:Ag, (Li, Na, K)$_3$ZrF$_7$:Mn, (Li, Na, K)$_2$(Ti, Zr)F$_6$:Mn, (Li, Na, K)$_2$(Si, Ge)F$_6$:Mn, (Ca, Sr, Ba)(Ti, Zr)F$_6$:Mn, (Sr, Ca)S:Eu, Y$_2$O$_3$:Eu, (Sr, Ca, Ba, Mg)$_5$(PO$_4$)$_3$Cl:Eu, (Ca, Sr, Ba)MgAl$_{10}$O$_7$:Eu, (Ca, Sr, Ba) Si$_2$O$_2$N$_2$:Eu.

The technical schemes of the disclosure have the beneficial technical effects as follows:

(1) GaYAG and YAG are both phosphor with garnet structure, sharing the same phase structure and belonging to the cubic crystal system; the phosphor with the garnet structure is formed by taking Ce as a light-emitting center with Y element, Al element, Ga element and O element in a certain ratio, so that the phosphor has a rigid network structure and thus stably maintains physical and chemical properties; and each element is controlled within the above-mentioned ratio range while any distance from the particle surface to the centroid is synergistically controlled as r, the ratio of the weight percentage of Ga elements in any unit volume in $r_{outer}$ to $r_{inner}$ is n, and 0≤n<1. The two are of the same structure, which is conducive to the fusion and growth of GaYAG and YAG, thus facilitating the growth and spherification of the crystal grain and improving the luminous efficiency and the packaging luminous efficiency significantly.

(2) The difference in Ga content between the inner and outer of phosphor of the present disclosure makes the finally obtained phosphor a shorter peak wavelength compared to the conventional phosphor with the same element content and better luminous efficiency at the same emission wavelength.

(3) The manufacturing method of the phosphor with garnet structure provided by the disclosure is simple and easy to implement, and the cost is lower than that of the conventional method of green phosphor containing GaYAG.

(4) The present disclosure can effectively blue-shift the spectrum for Ga-containing phosphor with garnet structure of the same element content, which improves the luminous efficiency as well as its luminous efficiency when applied to LEDs.

DETAILED DESCRIPTION OF THE EMBODIMENTS

In order to make the objectives, technical schemes, and advantages of the present disclosure more apparent, the present disclosure will be further described in detail below with reference to the accompanying drawings in combination with specific embodiments. It is to be understood that these descriptions are exemplary only and are not intended to limit the scope of the disclosure. Furthermore, in the following description, the descriptions of well-known structures and techniques are omitted in order to avoid unnecessarily obscuring the concept of the present disclosure.

In the present disclosure, the term "unit volume" does not refer to a particular volume and may refer to any volume within phosphor particles, but it is merely a relative volume concept proposed for the purpose of comparing the ratio of the weight percent of Ga element in any unit volume within the range from the centroid to the r of the particles with the weight percent of Ga element in any unit volume within the range from the r to the particle surface.

In order to improve the luminous efficiency of the GaYAG green phosphor in the background technology and reduce the cost, the disclosure provides a phosphor with garnet structure, which adopts the following technical schemes:

The phosphor comprises the following components in percentage by weight: 38.47-45.19% of Y element, 9.49-22.09% of Al element, 2.06-24.31% of Ga element, 27.3-32.04% of O element, 0.43-1.46% of Ce element. The shortest distance from the surface of one side of the particle to the surface of the opposite side through the centroid of the particle is defined as R, the longest distance is R1, and 5 µm≤R≤40 µm; any distance from the particle surface to the centroid is r, $0<r<½R$; and the space with the distance from the particle surface to the centroid direction being less than or equal to r is defined as $r_{inner}$, and the space with the distance from the particle surface to the centroid direction being greater than r is defined as $r_{outer}$, wherein the ratio of the weight percentage of Ga elements in any unit volume in $r_{outer}$ to $r_{inner}$ is n, and 0≤n<1.

Figure 1:
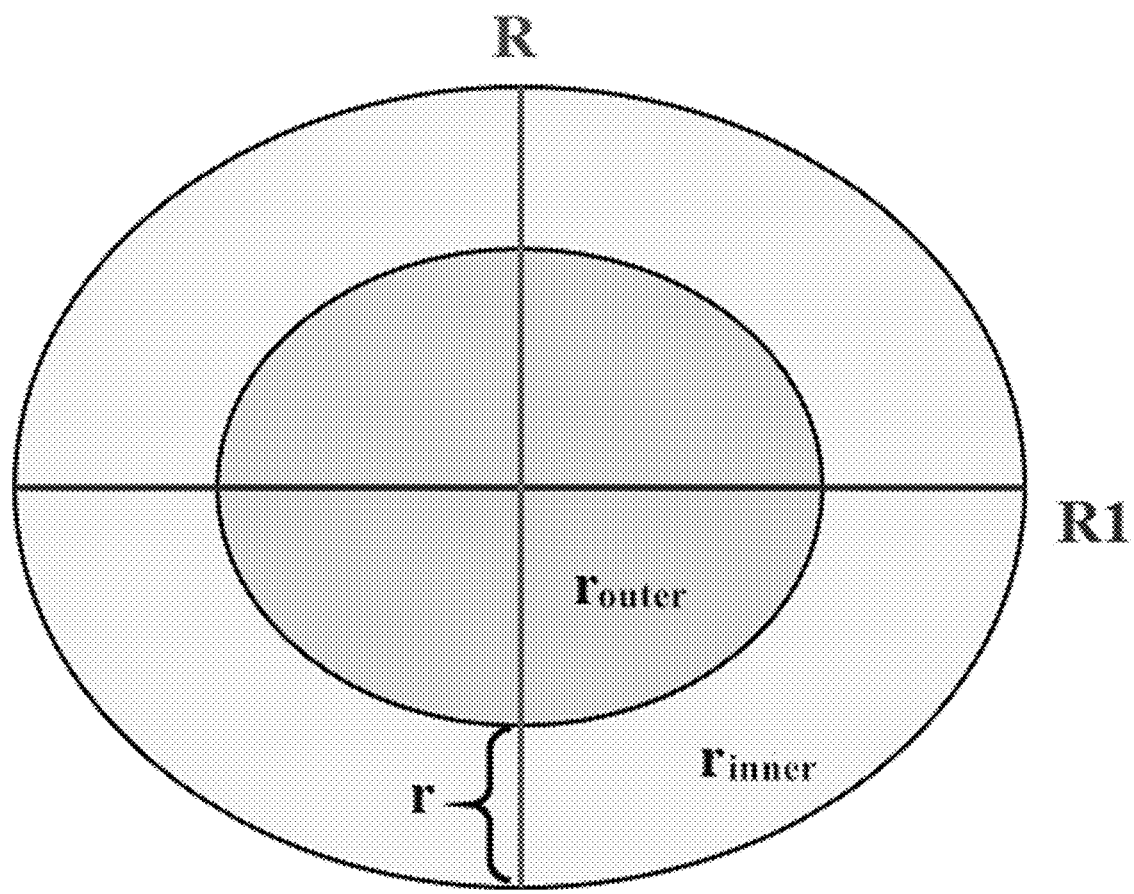
FIG. 1 is a schematic diagram of the structure of a phosphor particle.
Figure 2:
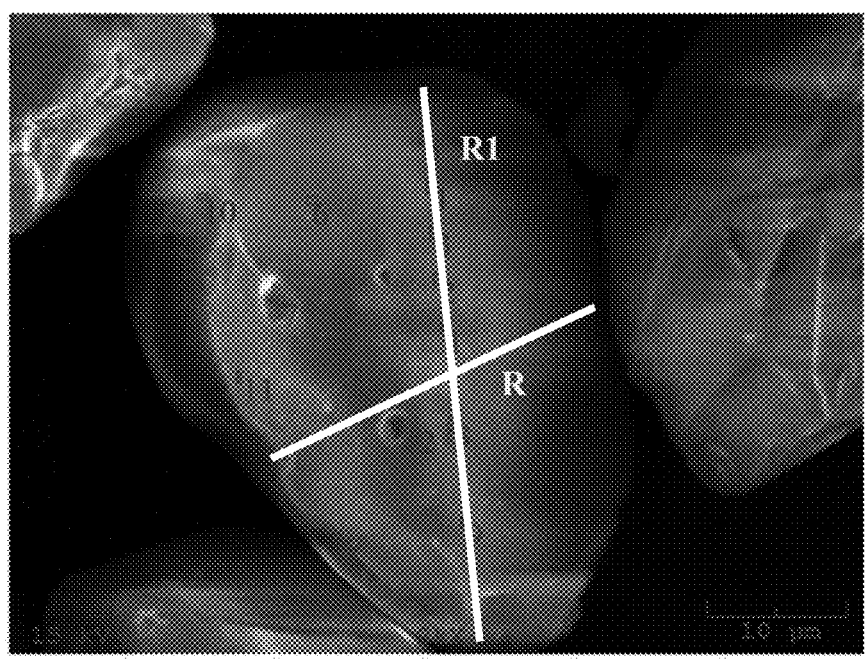
FIG. 2 is an EDS state diagram of the cross-section of a phosphor particle, obtained through scanning various Ga element content within the range.

Referring to FIGS. 1 and 2, R1 and R in the phosphor represent the D50 particle diameter (median particle diameter) of the phosphor, and the particle diameter distribution of the phosphor obtained by normal roasting conforms to a normal distribution diagram, so the implementation effect of the present disclosure, represented by R1 and R, is equally applicable to particles with all diameters in a normal distribution. Therefore, the present disclosure is universally applicable to phosphor represented by different D50 particle diameters, and is applicable to most of the crystal grains, though the case of anomalies in individual crystal grains cannot be excluded. In addition, the gradual increase or decrease in the weight percentage of Ga in any unit volume of phosphor particles in the present disclosure from the centroid of the particle surface direction is also within the scope of protection of the present disclosure.

According to the disclosure, the phosphor with the garnet structure is formed by taking Ce as an activator with Y element, Al element, Ga element and O element in a certain ratio, so that the phosphor has a rigid network structure and thus stably maintains physical and chemical properties. In the growth process of the crystal grains of the phosphor with the structure, the Ga-containing raw material increases its mass transfer under the function of fluxing agent as the sintering temperature gradually increases, which gradually diffuses to surround the phase-formed crystal grains with garnet structure which do not contain Ga or have low Ga content, and nucleates on the surface of the Ga-free crystal grains with garnet structure to fuse and thus grow. In the growing process, the surface of the formed phosphor particles are round and smooth, and a structure with large difference in Ga content between the inner and outer of phosphor particles is finally obtained. Compared with the conventional Ga-containing phosphor with garnet structure of the same element content, the phosphor with the structure disclosed by the disclosure achieves a blue-shift in spectrum in the test process and has less Ga content at the same peak emission wavelength.

Further, preferably, the phosphor comprises, in percentage by weight, 40.6-45.2% of Y element, 10.9-21.9% of Al element, 2.2-19.8% of Ga element, 27.7-32% of O element and 0.67-1.2% of Ce element.

The Ga-containing phosphor with garnet structure obtained by the elements within such weight percentage range has higher luminous efficiency.

Further, preferably, the value range of R of the phosphor is, 10 µm≤R≤30 µm. In terms of the application of conventional phosphor and the synthesis of phosphor, these particle diameters are within the best range for easy synthesis and mature application, with good luminescence performance and easy to package.

Further, preferably, the value range of r of the phosphor is, 0.5 µm≤r<½R.

Further, preferably, the value range of n of the phosphor is, 0≤n≤0.5.

Both r and n associated can affect the final implementation effect of the present disclosure, with a smaller r representing a smaller volume range in r and a larger r representing a larger volume range in r, both of which are not conducive to the comprehensive performance improvement of luminous efficiency, emission spectrum and particle diameter. In addition, a smaller n indicates a greater variability of Ga content between $r_{inner}$ and $r_{outer}$, which is more favorable to the implementation of the present disclosure, and vice versa.

Further, the peak wavelength of the phosphor with garnet structure is 515 nm to 550 nm under excitation of blue light excitation The phosphor with the garnet structure manufactured by the disclosure has three oxygen ligands, namely Y—O dodecahedron, Al—O octahedron and Al—O tetrahedron, so that the spectrum regulation can be adjusted through the crystal field intensity under different occupancy of $Ce^{3+}$ and $Ga^{3+}$: with the increase of the substitution of $Ce^{3+}$ to $Y^{3+}$, the crystal field of the garnet structure makes $Ce^{3+}$ energy level splitting larger and the spectrum long-wave shifted; and $Ga^{3+}$ will preferentially replace the octahedron $Al^{3+}$ after entering the lattice, so the increase of $Ga^{3+}$ can cause the expansion of the lattice constant, thereby reducing the crystal field intensity of $Ce^{3+}$ located at the center of the dodecahedron and making the spectrum short-wave shifted.

The disclosure provides a light-emitting device, comprising the phosphor with garnet structure of the disclosure.

Further, the light-emitting device further comprises other phosphor, including one or more of (Ca, Sr, Ba)AlSiN$_3$:Eu, (Mg, Ca, Sr, Ba)$_2$SiO$_4$:Eu, (Ca, Sr)$_3$SiO$_5$:Eu, ZnS:Cu, ZnS: Ag, (Li, Na, K)$_3$ZrF$_7$:Mn, (Li, Na, K)$_2$(Ti, Zr)F$_6$:Mn, (Li, Na, K)$_2$(Si, Ge)F$_6$:Mn, (Ca, Sr, Ba)(Ti, Zr)F$_6$:Mn, (Sr, Ca)S:Eu, Y$_2$O$_3$:Eu, (Sr, Ca, Ba, Mg)$_5$(PO$_4$)$_3$Cl:Eu, (Ca, Sr, Ba)MgAl$_{10}$O$_7$:Eu, (Ca, Sr, Ba) Si$_2$O$_2$N$_2$:Eu.

In the present disclosure, by changing the ratio of the Ga element and Ce element in the phosphor with the garnet structure, the main emission peak of the luminescent material can be adjusted for red-shift or blue-shift, thus changing the luminous color of the phosphor.

In the phosphor with the garnet structure, any distance from the particle surface to the centroid is r, the ratio of the weight percentage of Ga element in any unit volume in the range of $r_{outer}$ to that in the range of $r_{inner}$ is n, and a measuring method of n is as follows:

Firstly, an EDS device is adopted to randomly select a first point (for example, the unit volume of the first point is $1 \times 10-6 \sim 5 \times 10-2$ μm3) in the range from the particle centroid to the r for measurement, with any distance from the particle surface of phosphor with the garnet structure to the centroid being r, and the weight percentage of Ga element n1 at the point is measured.

Then, the EDS device is adopted to measure a second point in the garnet structure (the volume of the second point is equal to that of the first point) in any unit volume within the range from r to the particle surface, the weight percentage of Ga element n2 at the point is measured, and n1/n2=n. The measuring method is based on the existing EDS device, and there is no need to consider the specific unit volumes of the first and second points measured, provided that the volumes of the first and second points measured are equal. The detailed measurement is shown in FIG. 1, which is a schematic diagram of a particle, and FIG. 2, which is a cross-section diagram of a particle.

In the phosphor with the garnet structure, besides the elements Y, Al, Ga and Ce, other common chemical elements such as Lu, Sc, Tb, F and the like can be properly added in the phosphor with the garnet structure as required, provided that the garnet structure of the phosphor is still maintained and the content and ratio of Y, Al, Ga, Ce elements contained therein meet the above requirements.

Those skilled in the art can reasonably select a method well known to those skilled in the art to manufacture the phosphor with garnet structure under the guidance of the present disclosure. In the present disclosure, in order to reduce the operation difficulty of manufacturing the phosphor with garnet structure, simplify the operation steps and reduce the process cost, a preferable manufacturing method is provided, which comprises the following steps: firstly, mixing oxides of Y, Al or Al/Ga and Ce as raw material and then heating them to obtain an intermediate; secondly, mixing the Ga-containing intermediate or the Ga-free intermediate for secondary roasting, thereby obtaining the phosphor of the disclosure.

Figure 3:
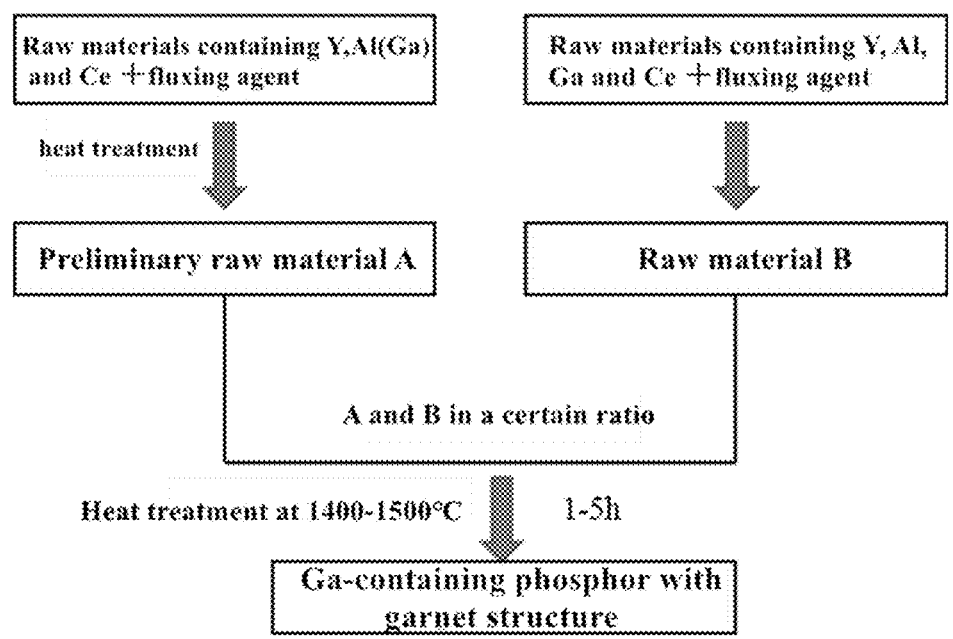
FIG. 3 is a flow chart of the manufacturing method.

Referring to FIG. 3, the manufacturing method of the phosphor with garnet structure comprises the following steps:
(1) weighing oxides, salts, fluorides and the like containing Y, Al or Al/Ga and Ce elements as raw material and mixing them with a fluxing agent in a mortar, and heating them at 1270-1500° C. to obtain a preliminary raw material A;
(2) weighing and uniformly mixing oxides of Y, Al, Ga and Ce elements as raw material to obtain a raw material B;
(3) and mixing the preliminary raw material A with different amount of the raw material B, and adding a fluxing agent after post-treatment and getting them uniformly mixed, followed by heating for 1 to 5 hours at 1400~1500° C. in a reducing atmosphere and post-treatment after sintering, thereby obtaining the phosphor with garnet structure.

Further, the weight ratio of the preliminary raw material A to the raw material B is 0.5:10 to 20:10; and the obtained phosphor with garnet structure comprise the following elements in percentage by weight: 38.47-45.19% of Y element, 9.49-22.09% of Al element, 2.06-24.31% of Ga element, 27.3-32.04% of O element and 0.43-1.46% of Ce element;

The amount of each raw material is weighed according to the weight percentage of each element of the phosphor with garnet structure, and the phosphor with garnet structure is manufactured through the above steps, wherein any distance from the particle surface to the centroid is r, the ratio of the weight percentage of Ga elements in any unit volume in $r_{outer}$ to $r_{inner}$ is n, and $0 \leq n < 1$.

The raw material is weighed according to the weight percentage of each element of the phosphor with garnet structure, wherein the oxides of Y, Al, Ga and Ce are respectively yttrium oxide, aluminum oxide, gallium oxide and cerium oxide.

Further, the fluxing agent in the steps of the method is at least one of alkali metal halide/oxide, alkaline earth metal halide/oxide, carbonate, and boric acid.

The above manufacturing method to synthesize phosphor with garnet structure is conducive to improving the brightness and stability of the phosphor; and in the manufacturing method, the fluxing agent is added to facilitate the nucleation and growth of the phosphor, wherein the fluxing agent is at least one of alkali metal halide/oxide, alkaline earth metal halide/oxide, carbonate and boric acid.

In order to further improve the quality of the phosphor with garnet structure of the present disclosure, during the manufacturing process, the intermediate and the sintered phosphor are subjected to a post-treatment process, which comprises at least one of crushing, washing and grading. The step of crushing in the post-treatment described above may form particles with particle diameters of 1-100 microns, e.g., 1 micron, 10 microns, 50 microns, 100 microns, etc. The washing process can be done with water or weak acid, etc., and the number of washing may be from 1 to 5 times, e.g. water washing for 1 time, 2 times, 3 times, or 5 times.

Hereinafter, the luminous efficiency of the phosphor with garnet structure of the present disclosure will be described by way of specific embodiments, thereby illustrating the beneficial effects of the present disclosure.

The testing method comprises the followings:

EDS detection: the test is carried out using an EDS device with an accelerating voltage of 15 kV and a detection current of 70 μA. Measurement of relative brightness: a spectrophotometer is used to test the relative brightness and peak wavelength of the green phosphor with garnet structure of comparative examples 1-4 and embodiments 1-24 of the present disclosure, with the excitation wavelength set at 460 nm.

Comparative Example 1

The raw material is weighed according to the weight percentage of 38.47% Y, 9.48% Al, 24.31% Ga, 27.31% O and 0.43% Ce elements in the Ga-containing phosphor with garnet structure, and BaF$_2$ fluxing agent is added to mix with them, wherein the obtained mixture is kept at 1450° C. for 3 hours and is taken out when the temperature is reduced to 100° C. After post-treatment, the phosphor with 517 nm wave band is obtained, and the relative brightness of the phosphor is defined as 100.

Embodiment 3

16.64 g of $Y_2O_3$, 13.42 g of $Al_2O_3$ and 0.18 g of $CeO_2$ are accurately weighed and mixed with BaF2 flux, followed by heating at 1300° C. to obtain the preliminary raw material A; 28.74 g of $Y_2O_3$, 9.27 g of $Al_2O_3$, 21.3 g of $Ga_2O_3$ and 0.31 g of $CeO_2$ are accurately weighed and mixed to obtain raw material B, which is mixed with raw material A at the ratio of 10:3, and a fluxing agent $BaF_2$ is added, followed by heating at 1450° C. for 1 hour in a reducing atmosphere (N2:H2=50:1) and is taken out when the temperature is reduced to below 100° C. The required phosphor with garnet structure is obtained after crushing, de-hybridizing and drying, wherein the weight percentage of Y, Al, Ga, O and Ce elements and the phosphor, R, r, the peak wavelength of n, and the relative brightness are shown in Table 1.

Comparative Example 2

The raw material is weighed according to the weight percentage of 40.72% Y, 11.33% Al, 19.03% Ga, 27.85% O and 1.07% Ce elements in the Ga-containing phosphor with garnet structure, and BaF2 fluxing agent $BaF_2$ is added to mix with them, wherein the obtained mixture is kept at the temperature of 1470° C. for 3 hours and is taken out when the temperature is reduced to 100° C. After post-treatment, the phosphor with 522 nm wave band is obtained, and the relative brightness of the phosphor is defined as 109.

Embodiment 7

17.83 g of $Y_2O_3$, 13.42 g of $Al_2O_3$ and 0.45 g of $CeO_2$ are accurately weighed and mixed with $BaF_2$ flux, followed by heating at 1350° C. to obtain the preliminary raw material A; 30.79 g of $Y_2O_3$, 11.59 g of $Al_2O_3$, 17.04 g of $Ga_2O_3$ and 0.78 g of $CeO_2$ are accurately weighed and mixed to obtain raw material B, which is mixed with raw material A at the ratio of 10:1, and a fluxing agent $BaF_2$ is added, followed by heating at 1470° C. for 1 h in a reducing atmosphere ($N_2:H_2$=50:1) and is taken out when the temperature is reduced to below 100° C. The required phosphor with garnet structure is obtained after crushing, de-hybridizing and drying treatment, wherein the weight percentage of Y, Al, Ga, O and Ce elements and the phosphor, R, r, the peak wavelength of n, and the relative brightness are shown in Table 1.

Comparative Example 3

The raw material is weighed according to the weight percentage of 40.72% Y, 11.33% Al, 19.03% Ga, 27.85% O and 1.07% Ce elements in the Ga-containing phosphor with garnet structure, and $BaF_2$ fluxing agent is added to mix with them, wherein the obtained mixture is kept at the temperature of 1500° C. for 3 hours and is taken out when the temperature is reduced to 100° C. After post-treatment, the phosphor with 550 nm wave band is obtained, and the relative brightness of the phosphor is defined as 120.

Embodiment 13

19.02 g of $Y_2O_3$, 14.76 g of $Al_2O_3$ and 0.63 g of $CeO_2$ are accurately weighed and mixed with $BaF_2$ fluxing agent, followed by heating at 1450° C. to obtain the preliminary raw material A; 32.84 g $Y_2O_3$, 25.49 g $Al_2O_3$, 2.56 g $Ga_2O_3$ and 1.10 g $CeO_2$ are accurately weighed and mixed to obtain raw material B, which is mixed with raw material A at the ratio of 2:1, and fluxing agents $BaF_2$ and $B_2O_3$ is added, followed by heating at 1500° C. for 1 hour in a reducing atmosphere ($N_2:H_2$=50:1) and is taken out when the temperature is reduced to below 100° C. The required phosphor with garnet structure is obtained after crushing, de-hybridizing and drying treatment, wherein the weight percentage of Y, Al, Ga, O and Ce elements and the phosphor, R, r, the peak wavelength of n, and the relative brightness are shown in Table 1.

Comparative Example 4

The raw material is weighed according to the weight percentage of 39.50% Y, 16.27% Al, 13.23% Ga, 29.91% O and 1.09% Ce elements in the Ga-containing phosphor with garnet structure, and $BaF_2$ fluxing agent is added to mix with them, wherein the obtained mixture is kept at the temperature of 1500° C. for 3 hours and is taken out when the temperature is reduced to 100° C. After post-treatment, the phosphor with 533 nm wave band is obtained, and the relative brightness of the phosphor is defined as 118.

Embodiment 16

16.64 g of $Y_2O_3$, 14.76 g of $Al_2O_3$ and 0.45 g of $CeO_2$ are accurately weighed and mixed with $BaF_2$ fluxing agent, followed by heating at 1350° C. to obtain the preliminary raw material A; 29.56 g of $Y_2O_3$, 15.76 g of $Al_2O_3$, 13.63 g of $Ga_2O_3$ and 0.78 g of $CeO_2$ are accurately weighed and mixed to obtain raw material B, which is mixed with raw material A at the ratio of 2:1, and fluxing agents $BaF_2$ and $YF_3$ is added, followed by heating at 1500° C. for 2 h in a reducing atmosphere ($N_2:H_2$=50:1) and is taken out when the temperature is reduced to below 100° C. The required phosphor with garnet structure is obtained after crushing, de-hybridizing and drying treatment, wherein the weight percentage of Y, Al, Ga, O and Ce elements and the phosphor, R, r, the peak wavelength of n, and the relative brightness are shown in Table 1.

Embodiment 22

16.64 g of $Y_2O_3$, 12.07 g of $Al_2O_3$, 1.97 g of $Ga_2O_3$ and 0.45 g of $CeO_2$ are accurately weighed and mixed with $BaF_2$ fluxing agent, followed by heating at 1500° C. to obtain the preliminary raw material A; 28.74 g of $Y_2O_3$, 16.68 g of $Al_2O_3$, 11.93 g of $Ga_2O_3$ and 0.63 g of $CeO_2$ are accurately weighed and mixed to obtain raw material B, which is mixed with raw material A at the ratio of 5:1, and fluxing agents $BaF_2$ and $YF_3$ is added, followed by heating at 1500° C. for 2 h in a reducing atmosphere ($N_2:H_2$=50:1) and is taken out when the temperature is reduced to below 100° C. The required phosphor with garnet structure is obtained after crushing, de-hybridizing and drying treatment, wherein the weight percentage of Y, Al, Ga, O and Ce elements and the phosphor, R, r, the peak wavelength of n, and the relative brightness are shown in Table 1.

Embodiments 1-24

The embodiments described above are representatives, and the manufacturing methods of the remaining embodiments are the same as those described above, that is, selecting an appropriate amount of compound for mixing and grinding, and an appropriate roasting condition according to the chemical formula composition of the target compound in each embodiment to obtain the required phosphor with garnet structure. The measured weight percentage and light color data are shown in Table 1.

TABLE 1

Weight percentage of elements, R, r, peak wavelength of n, and relative brightness of the phosphor of Embodiments 1-25

| | Weight percentage of Ga-containing phosphor with garnet structure | | | | | | | | Peak wavelength/ | Relative brightness |
| --- | --- | --- | --- | --- | --- | --- | --- | --- | --- | --- |
| | Y | AL | Ga | O | Ce | R2/μm | r/μm | n | nm | % |
| Comparative example 1 | 38.47 | 9.48 | 24.31 | 27.31 | 0.43 | 5 | — | — | 517 | 100 |
| Embodiment 1 | 38.47 | 9.48 | 24.31 | 27.31 | 0.43 | 5 | 0.1 | 0 | 517 | 104 |
| Embodiment 2 | 38.47 | 9.48 | 24.31 | 27.31 | 0.43 | 5 | 0.5 | 0 | 516 | 104 |
| Embodiment 3 | 38.47 | 9.48 | 24.31 | 27.31 | 0.43 | 5 | 1.0 | 0 | 515 | 105 |
| Embodiment 4 | 38.47 | 9.48 | 24.31 | 27.31 | 0.43 | 5 | 1.7 | 0 | 515 | 105 |
| Embodiment 5 | 38.47 | 9.48 | 24.31 | 27.31 | 0.43 | 5 | 2.0 | 0 | 515 | 102 |
| Comparative example 2 | 40.59 | 10.91 | 19.75 | 27.69 | 1.07 | 10 | — | — | 522 | 109 |
| Embodiment 6 | 40.59 | 10.91 | 19.75 | 27.69 | 1.07 | 10 | 0.2 | 0 | 522 | 113 |
| Embodiment 7 | 40.59 | 10.91 | 19.75 | 27.69 | 1.07 | 10 | 0.5 | 0 | 521 | 115 |
| Embodiment 8 | 40.59 | 10.91 | 19.75 | 27.69 | 1.07 | 10 | 1.0 | 0 | 520 | 115 |
| Embodiment 9 | 40.59 | 10.91 | 19.75 | 27.69 | 1.07 | 10 | 3.3 | 0 | 520 | 114 |
| Embodiment 10 | 40.59 | 10.91 | 19.75 | 27.69 | 1.07 | 10 | 4.0 | 0 | 520 | 112 |
| Comparative example 3 | 42.35 | 22.09 | 2.06 | 32.04 | 1.46 | 10 | — | — | 550 | 120 |
| Embodiment 11 | 42.70 | 21.83 | 233 | 31.95 | 1.18 | 30 | 7.0 | 0 | 543 | 122 |
| Embodiment 12 | 45.19 | 20.57 | 2.20 | 31.37 | 0.67 | 20 | 5.0 | 0 | 540 | 121 |
| Embodiment 13 | 42.35 | 22.09 | 2.06 | 32.04 | 1.46 | 40 | 10.0 | 0 | 548 | 124 |
| Comparative example 4 | 39.50 | 16.27 | 13.23 | 29.91 | 1.09 | 20 | — | — | 533 | 118 |
| Embodiment 14 | 39.50 | 16.27 | 13.23 | 29.91 | 1.09 | 20 | 0.5 | 0 | 532 | 120 |
| Embodiment 15 | 39.50 | 16.27 | 13.23 | 29.91 | 1.09 | 20 | 5.0 | 0 | 531 | 121 |
| Embodiment 16 | 39.50 | 16.27 | 13.23 | 29.91 | 1.09 | 20 | 6.7 | 0 | 530 | 121 |
| Embodiment 17 | 39.50 | 16.27 | 13.23 | 29.91 | 1.09 | 20 | 8.0 | 0 | 533 | 120 |
| Embodiment 18 | 39.50 | 16.27 | 13.23 | 29.91 | 1.09 | 30 | 0.5 | 0 | 531 | 122 |
| Embodiment 19 | 39.50 | 16.27 | 13.23 | 29.91 | 1.09 | 30 | 6.0 | 0 | 530 | 123 |
| Embodiment 20 | 39.50 | 16.27 | 13.23 | 29.91 | 1.09 | 30 | 10.0 | 0 | 530 | 123 |
| Embodiment 21 | 40.40 | 17.21 | 11.04 | 30.23 | 1.12 | 30 | 6.0 | 0 | 533 | 123 |
| Embodiment 22 | 39.50 | 16.27 | 13.23 | 29.91 | 1.09 | 30 | 6.0 | 0.3 | 531 | 123 |
| Embodiment 23 | 39.50 | 16.27 | 13.23 | 29.91 | 1.09 | 30 | 6.0 | 0.5 | 531 | 122 |
| Embodiment 24 | 39.50 | 16.27 | 13.23 | 29.91 | 1.09 | 30 | 6.0 | 0.8 | 531 | 120 |

As can be seen from data in Embodiments 1-24, the phosphor with garnet structure provided by the present disclosure is formed by Ce as the excitation source with Y element, Al element, Ga element, O element at a certain ratio, wherein the spectrum short-wave shifts with more Ga replacing Al; as more Ce replaces Y, the energy level splitting of Ce increases, making the spectrum long-wave shifted; and in addition, the distance of the phosphor with the garnet structure from the particle surface to the centroid is collaboratively controlled as r, the ratio of the weight percentage of Ga elements in any unit volume in $r_{outer}$ to $r_{inner}$ is n. As shown in Embodiments 1-5, 6-10 and 14-17, the emission spectrum of the phosphor with the structure can be effectively blue-shifted as r increases compared with other phosphor of the same content, and the smaller r is or the closer r is to ½R, the closer it is to the internal structure of the phosphor in the comparative examples and the smaller the difference is between the inner and outer of phosphor, with lower degree of waveband reduction; as shown in Embodiments 19 and 22-24, the smaller n is, the greater the difference is in the weight percentages of Ga elements with the Ga content of $r_{inner}$ being much larger than $r_{outer}$, thereby effectively reducing the wave band of the phosphor and the content of Ga element to a certain extent and reducing the cost compared with the conventional Ga-containing phosphor with garnet structure of the same element content; and the particle of phosphor is grown with more rounded surface, which improves the luminous efficiency of the phosphor.

The following are specific embodiments of the present disclosure:

Comparative Example 5

In this embodiment, a blue LED chip is used as a radiation source, the phosphor of Comparative Example 4 and CaAlSiN$_3$:Eu are uniformly mixed at a weight ratio of 94:4.5, with the mixture then evenly dispersed in silica gel (refractive index: 1.41, transmittance: 99%), and the chip and the light conversion layer are combined to obtain a white light-emitting device after soldering the circuit and packaging.

Embodiments 26-32 adopt the same blue LED chip as in Comparative Example 5 as the radiation source, and the phosphor of Embodiments 14-17, Embodiment 19 and Embodiments 22-24 of the present disclosure and CaAlSiN$_3$:Eu are uniformly mixed also at the weight ratio of 94:4.5, with the mixture dispersed in silica gel and finally packaged into white light-emitting devices.

The photochromic data of the devices in Comparative Example 5 and Embodiments 25-32 are shown in Table 2.

TABLE 2

Package data of devices with the phosphor of the present disclosure and comparative examples

| | | Luminous efficiency (LM/W) | x | y | Color Temperature | Ra |
|---|---|---|---|---|---|---|
| Comparative example 5 | Blue chip + comparative example 4 green phosphor + red phosphor | 180 | 0.316 | 0.341 | 6210 | 80 |
| Embodiment 25 | Blue chip + green phosphor of embodiment 14 + red phosphor | 181 | 0.316 | 0.341 | 6216 | 80.3 |
| Embodiment 26 | Blue chip + green phosphor of embodiment 15 + red phosphor | 182 | 0.316 | 0.341 | 6209 | 80.8 |
| Embodiment 27 | Blue chip + green phosphor of embodiment 16 + red phosphor | 182 | 0.316 | 0.341 | 6220 | 80.8 |
| Embodiment 28 | Blue chip + green phosphor of embodiment 17 + red phosphor | 181 | 0.316 | 0.341 | 6219 | 80.1 |
| Embodiment 29 | Blue chip + green phosphor of embodiment 19 + red phosphor | 183 | 0.317 | 0.34 | 6219 | 80.6 |
| Embodiment 30 | Blue chip + green phosphor of embodiment 22 + red phosphor | 182.5 | 0.317 | 0.34 | 6220 | 80.5 |
| Embodiment 31 | Blue chip + green phosphor of embodiment 23 + red phosphor | 182.5 | 0.317 | 0.34 | 6220 | 80.4 |
| Embodiment 32 | Blue chip + green phosphor of embodiment 24 + red phosphor | 181 | 0.317 | 0.34 | 6219 | 80.2 |

As can be seen from the table, when a white light-emitting device is manufactured by using the phosphor with garnet structure mixed with other phosphor in Comparative Example 4, Embodiments 14-17, Embodiment 19, and Embodiments 22-24, the light efficiency is improved and the color rendering index Ra is increased as r increases while the light efficiency decreases as n increases. However, the phosphor with garnet structure within the protection scope of the present disclosure can be used with other types of phosphors in practical applications, which enables the light-emitting device containing such phosphor to be of high luminous efficiency.

Embodiment 33

The phosphor in Embodiment 14, CaAlSiN3:Eu, and low-temperature glass powder are mixed at a weight ratio of 1:0.05:10, with the glass powder made up of $SiO_2$, $Al_2O_3$, $B_2O_3$, and alkali metal oxides ($Na_2O$, $K_2O$) or divalent metal oxides (CaO, SrO, BaO, ZnO). The glass substrate is obtained after low temperature co-melting, and the fluorescent glass sheet with the size of 2.8×3.5×0.15 mm is obtained after thinning, polishing and dicing. The glass sheet is packaged with a blue LED chip to obtain a light-emitting device with a color coordinate (0.3132,0.3555), a color temperature of 6300K, and a color rendering index Ra of 82.

The light attenuation of the device in the embodiment is 5% after aging upon lighting at 1000° C. with the supply current of 1 A, while the light attenuation of the devices in Embodiments 25-32 reaches 15-20% after aging for the same time with the same current, which indicates that the fluorescent conversion layer in the glass state can be better applied to light sources with high-power density.

In summary, the disclosure relates to a phosphor with garnet structure and a light-emitting device comprising the phosphor, wherein the phosphor comprises the following components in percentage by weight: 38.47-45.19% of Y element, 9.49-22.09% of Al element, 2.06-24.31% of Ga element, 27.3-32.04% of O element, 0.43-1.46% of Ce element. In phosphor particles, the shortest distance from the surface of one side of the particle to the surface of the opposite side through the centroid of the particle is defined as R, the longest distance is R1, and 5 μm≤R≤40 μm; any distance from the particle surface to the centroid is r, and 0<r<½R; and the space with the distance from the particle surface to the centroid direction being less than or equal to r is defined as $r_{inner}$, and the space with the distance from the particle surface to the centroid direction being greater than r is defined as $r_{outer}$, whereat the ratio of the weight percentage of Ga elements in any unit volume in $r_{outer}$ to $r_{inner}$ is n, and 0≤n<1. The phosphor disclosed by the disclosure can be effectively excited by blue light, and has the characteristics of high emission efficiency, tunable spectrum and capability of reducing the manufacturing cost.

It should be understood that the above-described specific embodiments of the present disclosure are used for exemplary illustration or explanation of principles of the present disclosure only and should not be construed as limitations of the disclosure. Accordingly, any modifications, equivalents, improvements and the like made without departing from the spirit and scope of the present disclosure shall fall within the protection scope of the present disclosure. Moreover, the appended claims are intended to cover all changes and modifications that fall within the scope and boundary of the appended claims, or the equivalents thereof.

What is claimed is:

1. A phosphor with garnet structure, wherein the phosphor comprises the following components in percentage by weight: 38.47-45.19% of Y element, 9.49-22.09% of Al element, 2.06-24.31% of Ga element, 27.3-32.04% of O element and 0.43-1.46% of Ce element; the shortest distance from the surface of one side of the phosphor to the surface of the opposite side through the centroid of the phosphor is defined as R, 5 μm≤R≤40 μm;

any distance from the phosphor surface to the centroid is r, 0<r<½R; and the space with the distance from the phosphor surface to the centroid direction being less than or equal to r is defined as $r_{inner}$, and the space with the distance from the phosphor surface to the centroid direction being greater than r is defined as $r_{outer}$, whereat the ratio of the weight percentage of Ga elements in any unit volume in $r_{outer}$ to $r_{inner}$ is n, and 0≤n≤1.

2. The phosphor of claim 1, wherein R of the phosphor is 10 μm≤R≤30 μm.

3. The phosphor with garnet structure of claim 2, wherein the value range of r is, 0.5 μm≤r≤⅓R.

4. The phosphor with garnet structure of claim 3, wherein the value range of n is, 0≤n≤0.5.

5. The phosphor of claim 1, wherein the phosphor comprises, in percentage by weight, 40.6-45.2% of Y element, 10.9-21.9% of Al element, 2.2-19.8% of Ga element, 27.7-32% of O element, 0.67-1.2% of Ce element.

6. The phosphor of claim 5, wherein R of the phosphor is 10 μm≤R≤30 μm.

7. The phosphor with garnet structure of claim 1, wherein the peak wavelength thereof is 515 nm to 550 nm under excitation of blue light.

8. The phosphor with garnet structure of claim 5, wherein the peak wavelength thereof is 515 nm to 550 nm under excitation of blue light.

9. The phosphor with garnet structure of claim 2, wherein the peak wavelength thereof is 515 nm to 550 nm under excitation of blue light.

10. The phosphor with garnet structure of claim 3, wherein the peak wavelength thereof is 515 nm to 550 nm under excitation of blue light.

11. The phosphor with garnet structure of claim 4, wherein the peak wavelength thereof is 515 nm to 550 nm under excitation of blue light.

12. A light-emitting device, comprises the phosphor with garnet structure of claim 1.

13. The light-emitting device of claim 12, further comprising other phosphor, wherein the other phosphor comprises one or more of (Ca, Sr, Ba)AlSiN$_3$:Eu, (Mg, Ca, Sr, Ba)$_2$SiO$_4$:Eu, (Ca, Sr)$_3$SiO$_5$:Eu, ZnS:Cu, ZnS:Ag, (Li, Na, K)$_3$ZrF$_7$:Mn, (Li, Na, K)$_2$(Ti, Zr)F$_6$:Mn, (Li, Na, K)$_2$(Si, Ge)F$_6$:Mn, (Ca, Sr, Ba)(Ti,Zr)F$_6$:Mn, (Sr, Ca)S:Eu, Y$_2$O$_3$:Eu, (Sr, Ca, Ba, Mg)$_5$(PO$_4$)$_3$Cl:Eu, (Ca, Sr, Ba)MgAl$_{10}$O$_7$:Eu, (Ca, Sr, Ba) Si$_2$O$_2$N$_2$:Eu.

14. The light-emitting device of claim 12, wherein the phosphor comprises, in percentage by weight, 40.6-45.2% of Y element, 10.9-21.9% of Al element, 2.2-19.8% of Ga element, 27.7-32% of O element, 0.67-1.2% of Ce element.

15. The light-emitting device of claim 12, wherein R of the phosphor is 10 μm≤R≤30 μm.

16. The light-emitting device of claim 15, wherein the value range of r is, 0.5 μm≤r≤⅓R.

17. The light-emitting device of claim 16, wherein the value range of n is, 0≤n≤0.5.

18. The light-emitting device of claim 12, wherein the peak wavelength thereof is 515 nm to 550 nm under excitation of blue light.

* * * * *